US012572067B2

(12) United States Patent
Holmes et al.

(10) Patent No.: US 12,572,067 B2
(45) Date of Patent: Mar. 10, 2026

(54) GUIDING STRUCTURES FOR FABRICATION OF ANGLED FEATURES IN A SEMICONDUCTOR DEVICE

(71) Applicant: International Business Machines Corporation, Armonk, NY (US)

(72) Inventors: Steven Holmes, Red Hook, NY (US); Pouya Hashemi, Purchase, NY (US); Robert L. Bruce, White Plains, NY (US); Eric A. Joseph, Croton on Hudson, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 18/189,189

(22) Filed: Mar. 23, 2023

(65) Prior Publication Data

US 2024/0319591 A1     Sep. 26, 2024

(51) Int. Cl.
| | |
|---|---|
| *G03F 7/00* | (2006.01) |
| *H01F 41/22* | (2006.01) |
| *H01J 37/305* | (2006.01) |

(52) U.S. Cl.
CPC .......... *G03F 7/0015* (2013.01); *G03F 7/0002* (2013.01); *H01J 37/3053* (2013.01); *H01F 41/22* (2013.01)

(58) Field of Classification Search
CPC .. G03F 7/0015; G03F 7/0002; H01J 37/3053; H01F 41/22
USPC ........................................................ 430/320
See application file for complete search history.

(56) References Cited

U.S. PATENT DOCUMENTS

| | | | |
|---|---|---|---|
| 4,424,102 | A | 1/1984 | Brandeis |
| 6,420,713 | B1 | 7/2002 | Stickel |
| 6,982,442 | B2 | 1/2006 | Chan |
| 8,343,877 | B2 | 1/2013 | Cheng |
| 8,853,752 | B2 | 10/2014 | Bazizi |
| 9,299,787 | B1 | 3/2016 | Cheng |

(Continued)

FOREIGN PATENT DOCUMENTS

| | | |
|---|---|---|
| CN | 107731890 A | 2/2018 |
| CN | 111524798 B | 5/2022 |

OTHER PUBLICATIONS

Aguinsky, et al, "Phenomenological modeling of low-bias sulfur hexafluoride plasma etching of silicon", Solid-State Electronics, Vo. 191, Article 108262, Feb. 25, 2022, 8 pages.

(Continued)

*Primary Examiner* — Caleen O Sullivan
(74) *Attorney, Agent, or Firm* — Kimberly Zillig

(57) ABSTRACT

A semiconductor structure includes a first plurality of slanted features within a first region of a substrate. Two or more magnetic guiding structures are embedded within the first region of the substrate. The first plurality of slanted features is located between the two or more magnetic guiding structures for varying a magnetic field strength around the first plurality of slanted features. A second plurality of slanted features are located within a second region of the substrate. The second region of the substrate is adjacent to the first region of the substrate. The second plurality of slanted features include a second orientation angle that is different from a first orientation angle of the first plurality of slanted features.

22 Claims, 9 Drawing Sheets

(56) References Cited

U.S. PATENT DOCUMENTS

| | | | |
|---|---|---|---|
| 9,972,677 | B2 | 5/2018 | Van Brunt |
| 10,026,613 | B2 | 7/2018 | Srinivasan |
| 10,128,083 | B2 | 11/2018 | Druz |
| 10,347,501 | B2 | 7/2019 | Liu |
| 10,388,493 | B2 | 8/2019 | Singh |
| 10,510,743 | B2 | 12/2019 | Han |
| 10,818,505 | B2 | 10/2020 | Wang |
| 11,010,526 | B2 | 5/2021 | Wang |
| 2005/0151165 | A1 | 7/2005 | Chan |
| 2011/0111592 | A1 | 5/2011 | Cheng |
| 2013/0072025 | A1 | 3/2013 | Singh |
| 2013/0330511 | A1 | 12/2013 | Sharifi |
| 2014/0117417 | A1 | 5/2014 | Bazizi |
| 2015/0097204 | A1 | 4/2015 | Takada et al. |
| 2015/0333223 | A1 | 11/2015 | Wu |
| 2016/0093695 | A1 | 3/2016 | Cheng |
| 2017/0047396 | A1 | 2/2017 | Van Brunt |
| 2017/0330750 | A1 | 11/2017 | Srinivasan |
| 2018/0130668 | A1 | 5/2018 | Liu |
| 2019/0027470 | A1 | 1/2019 | Han |
| 2019/0067020 | A1 | 2/2019 | Tsai et al. |
| 2019/0369321 | A1 | 12/2019 | Young et al. |
| 2020/0058514 | A1 | 2/2020 | Wang |
| 2020/0134250 | A1 | 4/2020 | Wang |
| 2020/0249386 | A1 | 8/2020 | Mohanty et al. |
| 2021/0249351 | A1 | 8/2021 | Anderson et al. |
| 2022/0057710 | A1 | 2/2022 | Young et al. |
| 2022/0246433 | A1 | 8/2022 | Lin |
| 2022/0359217 | A1 | 11/2022 | Andersen |
| 2024/0248240 | A1* | 7/2024 | Hansson .............. G02B 5/1852 |

OTHER PUBLICATIONS

Arya, et al, "Which factor determines the optical losses in refractory tungsten thin films at high temperatures?", Applied Surface Science, Issue 588, Article 12927, Mar. 4, 2022, 10 pages.

Hashemi, et al., "Fabrication of Asymmetric Mandrel Structures in Semiconductor Device", Application No. *, Mar. 23, 2023.

Hashemi, et al., "Fabrication of Angled Mandrel Structures in Semiconductor Device", Application No. *, Mar. 23, 2023.

IBM, List of IBM Patents or Patent Applications Treated as Related, Filed Herewith, 2 pages.

IP et al., "Reactive ion beam etch of slanted gratings for augmented reality", Proceedings of SPIE 11696, Advanced Fabrication Technologies for Micro/Nano Optics and Photonics XIV, 1169604, Mar. 5, 2021, Video Presentation Transcript, 5 pages, <https://doi.org/10.1117/12.2582875>.

IP et al., "Reactive ion beam etch of slanted gratings for augmented reality," https://doi.org/10.1117/12.2582752, Proceedings vol. 11615, Advanced Etch Technology and Process Integration for Nanopatterning X, vol. 116150, Abstract Only, Feb. 22, 2021, 1 page, <https://doi.org/10.1117/12.2582752>.

Kim, et al, "Macroscopic mapping of microscale fibers in freeform injection molded fiber-reinforced composites using X-ray scattering tensor tomography," Composites Part B, Issue 233, Article 109634, Jan. 20, 2022, 11 pages.

Shi et al., "High aspect ratio tilted gratings through local electric field modulation in plasma etching," Applied Surface Science 588 (2022) 152938, 10 pages, <https://doi.org/10.1016/j.apsusc.2022.152938>.

Stark, et al., "Slanted gratings with varying slant angle by localized reactive ion beam processing", Proceedings of SPIE Digital Optical Technologies 2021, vol. 11788, 8 pages.

Xiong et al., "Augmented reality and virtual reality displays: emerging technologies and future perspectives," Light: Science & Applications (2021) 10:216, pp. 1-30.

* cited by examiner

GUIDING STRUCTURES FOR FABRICATION OF ANGLED FEATURES IN A SEMICONDUCTOR DEVICE

BACKGROUND

The present invention generally relates to the field of semiconductor devices, and more particularly to nanofabrication techniques and structures.

An artificial reality system, such as a head-mounted display (HMD) or heads-up display (HUD) system, generally includes a display configured to present artificial images that depict objects in a virtual environment. The display may show virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). The optical components are arranged to transport light of the desired image, where the light is generated on the display to the user's eye to make the image visible to the user. The display where the image is generated can form part of a light engine, so the image generates collimated light beams guided by the optical component to provide an image visible to the user.

In some implementations, the light of the projected images may be coupled into or out of the waveguide using a diffractive optical element, such as a slanted surface-relief grating. Slanted gratings show high efficiency in coupling light into waveguides. However, fabrication of master molds used for producing slanted gratings requires high etch selectivity between $SiO_2$ and a metal mask. Additionally, the industry standard for trench etch, reactive ion etching (RIE), cannot produce slanted trenches, and other techniques such as reactive ion beam etching (RIBE) can only produce slanted trenches at a single angle and in a single direction. Therefore, there is a need for improved designs and techniques for producing slanted trench features within a substrate.

SUMMARY

Shortcomings of the prior art are overcome and additional advantages are provided through the provision of a semiconductor structure, and a method of making the same, including magnetic guiding structures for simultaneously forming a plurality of angled trench features at different angles and orientations into a single substrate that can be used as a mold for nanoimprint lithography and/or as optical waveguides in augmented reality displays.

According to an embodiment, the semiconductor structure includes a first plurality of slanted features within a first region of a substrate, and two or more magnetic guiding structures embedded within the first region of the substrate, with the first plurality of slanted features being located between the two or more magnetic guiding structures for varying a magnetic field strength around the first plurality of slanted features. The semiconductor structure further includes a second plurality of slanted features within a second region of the substrate adjacent to the first region of the substrate. The second plurality of slanted features include a second orientation angle different from a first orientation angle of the first plurality of slanted features.

According to another embodiment of the present disclosure, the method includes forming a first plurality of slanted trench features within a first region of a substrate, the plurality of first slanted trench features being located between two or more guiding structures, and the two or more guiding structures being embedded within the first region of the substrate for generating a magnetic field near the plurality of first slanted trench features, and forming a second plurality of slanted trench features within a second region of the substrate adjacent to the first region of the substrate. A distance between the first region of the substrate and the second region of the substrate is selected based on the magnetic field not affecting the second region of the substrate.

According to yet another embodiment, the semiconductor structure includes a first plurality of slanted features within a first region of a substrate, and a second plurality of slanted features within a second region of the substrate adjacent to the first region of the substrate, the first plurality of slanted features and the second plurality of slanted features providing a mold for nanoimprint lithography.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figures 1A, 1B:
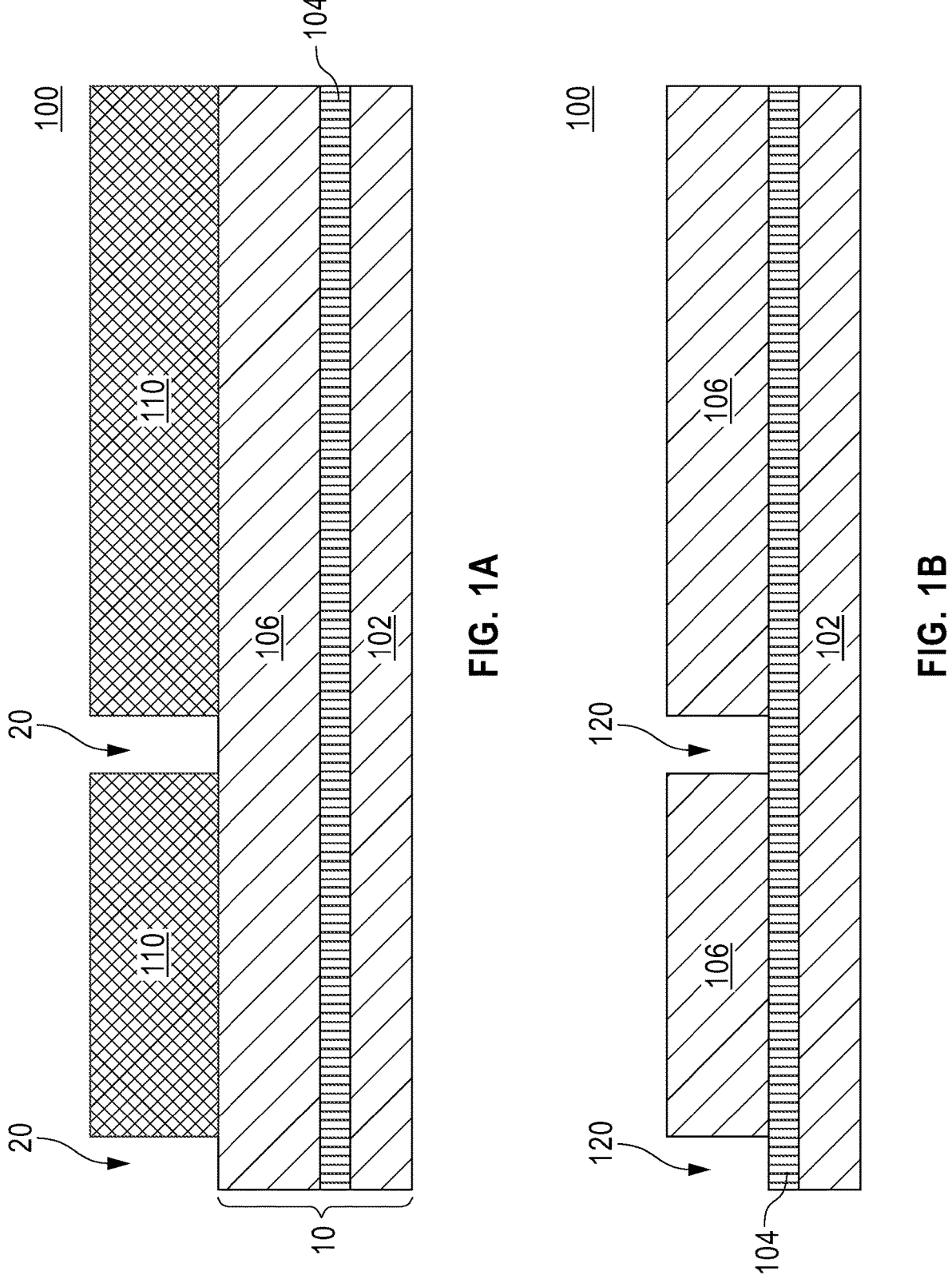
FIG. 1A is a cross-sectional view of a first semiconductor structure at an intermediate step during a semiconductor manufacturing process, according to an embodiment of the present disclosure.
FIG. 1B is a cross-sectional view of the first semiconductor structure after transferring a first pattern to a silicon-on-insulator layer to form first trenches, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Fabrication of slanted or angled trench features vertically into a substrate is needed for augmented reality (AR) devices. Current state-of-the-art technology uses reactive ion beam etching (RIBE) at an angle to form such features by means of tilting the entire wafer inside the etch chamber. In such a system, only single angle trench features at a single direction can be formed on the substrate. Moreover, the use of RIBE for forming angled features for AR displays may hinder reaching a needed depth due to redeposition issues during the etch process and low selectivity of the etch mask. In some cases, the critical dimension (CD) and profile control of angled mandrel structures that are used as a mold can also be degraded by the redeposition issues.

As a result, it may be desired to form angled trench features at a variety of different angles and at a variety of different orientations (e.g., X and Y orientations) on the same substrate at the same time such that the angled trench features can be used as a mold for nanoimprint lithography (NIL) and/or as optical waveguides in AR displays. Wafer-level NIL has increasingly become a key enabling technology to support AR devices, optical sensors, and biomedical chips, among other technologies. NIL may allow mass manufacture of micro- and nano-scale structures with a maximum degree of freedom for the device dimensions. Another key advantage of this replication-based technology is, given by the fact that even complex structures which require precise and time-consuming fabrication methods can be transferred to mass manufacturing in an efficient semiconductor manufacturing line. Additionally, for many devices, especially for optical applications, a replicated layer can be directly used as a functional layer in the product.

Therefore, embodiments of the present disclosure provide a semiconductor structure, and a method of making the same, including embedded magnetic guiding structures located in and around the intended device array for the purpose of altering a direction of etching processes at specific locations within the chip. The proposed embodiments allow producing slanted trench features including a variety of different angles and orientations by altering the design, placement and extent of magnetization or charging on the embedded electrodes. More particularly, by embedding the magnetic guiding structures in and around the array of product structures, embodiments of the present disclosure allow varying the angle and orientation of etched trenches at the same time within a single substrate. The resulting angled trench features can be used as a template structure for making an imprint hardmask.

In additional embodiments of the present disclosure, the magnetic guiding structures are formed above a substrate for altering a direction of etching processes at specific locations within the chip. In such embodiments, the magnetic guiding structures can be removed from the semiconductor device after forming the slanted trench features.

An embodiment by which the semiconductor structure having slanted trench features formed at different angles and orientations can be formed is described in detail below by referring to the accompanying drawings in FIGS. 1A-1K. Another embodiment by which the semiconductor structure having slanted trench features formed at different angles and orientations can be formed is described in detail below by referring to the accompanying drawings in FIGS. 2A-2H.

Referring now to FIG. 1A, a cross-sectional view of a first semiconductor structure 100 at an intermediate step during a semiconductor manufacturing process is shown, according to an embodiment of the present disclosure. Particularly, in this embodiment, the described intermediate step includes a first step during the process of forming slanted trench features at different angles within a first substrate 10.

According to an embodiment, the first substrate 10 may include a silicon-on-insulator (SOI) substrate typically composed of a base substrate 102, a buried dielectric layer 104 (e.g., buried oxide) formed on top of the base substrate 102, and a SOI layer 106 formed on top of the buried dielectric layer 104. According to an embodiment, the buried dielectric layer 104 and the SOI layer 106 are vertically stacked one on top of another in a direction perpendicular to the base substrate 102, as illustrated in the figure. The buried dielectric layer 104 isolates the SOI layer 106 from the base substrate 102.

The base substrate 102 may be made from any of several known semiconductor materials such as, for example, silicon, germanium, silicon-germanium alloy, silicon carbide, silicon-germanium carbide alloy, and compound (e.g., III-V and II-VI) semiconductor materials. Non-limiting examples of compound semiconductor materials include gallium arsenide, indium arsenide, and indium phosphide. Typically, the base substrate 102 may be about, but is not limited to, several hundred microns thick. For example, the base substrate 102 may include a thickness ranging from 0.5 mm to about 1.5 mm. In some embodiments, the base substrate 102 may be, for example, a bulk substrate.

The buried dielectric layer 104 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 104 may include a crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. The buried dielectric layer 104 may include a thickness ranging from approximately 20 nm to approximately 100 nm, and ranges therebetween.

The SOI layer 106 may include any of the several semiconductor materials included in the base substrate 102. In general, the base substrate 102 and the SOI layer 106 may be made of either identical or different semiconductor materials with respect to chemical composition, dopant concentration and crystallographic orientation. In an embodiment of the present invention, the base substrate 102 and the SOI layer 106 are made of silicon. The SOI layer 106 may have a thickness varying preferably from approximately 250 nm to approximately 300 nm. Although, in some embodiments, the SOI layer 106 may have a thickness of up to 500 nm. As may be known by those skilled in the art, in some embodiments, the SOI layer 106 may be entirely consumed during subsequent patterning processes. Methods for forming the SOI layer 106 are well known in the art and will not be described in detail herein to avoid unnecessarily obscuring the presented embodiments.

With continued reference to FIG. 1A, a first photoresist layer 110 is formed above the SOI layer 106. A first pattern 20 is exposed on the first photoresist layer 110 to be transferred to the SOI layer 106, as will be described in detail below.

Referring now to FIG. 1B, a cross-sectional view of the first semiconductor structure 100 is shown after transferring the first pattern 20 to the SOI layer 106 to form first trenches 120, according to an embodiment of the present disclosure.

The first photoresist layer 110 (FIG. 1A) is deposited above the SOI layer 106 for forming the first trenches 120 using well-known lithography and reactive ion etch (RIE) processing. Patterning of the SOI layer 106 to form the first trenches 120 involves exposing the first pattern 20 shown in FIG. 1A on the first photoresist layer 110 and transferring the exposed pattern to the SOI layer 106, as shown in FIG. 1B. After transferring the first pattern 20 and forming the first trenches 120, the first photoresist layer 110 can be removed using any photoresist striping method known in the art including, for example, plasma ashing.

The etching process used to form the first trenches 120 can be conducted until reaching an uppermost surface of the buried oxide layer 104. Thus, in this embodiment, the buried oxide layer 104 acts as an etch stop layer. As depicted in the figure, first trenches 120 expose the uppermost surface of the buried oxide layer 104. In one or more embodiments, a location of the first trenches 120 is selected based on design requirements. Particularly, based on a location of subsequently formed slanted trench features.

In some embodiments, the etching process can be conducted until reaching the base substrate 102 (not depicted in the figures). In such embodiments, a depth of the first trenches 120 may be substantially deeper than a depth of the first trenches 120 depicted in FIG. 1B. For example, the first trenches 120 extending into the base substrate 102 may have a depth of approximately 1-2 microns, with this depth depending on the needed strength of the magnetic field.

Figures 1C, 1D:
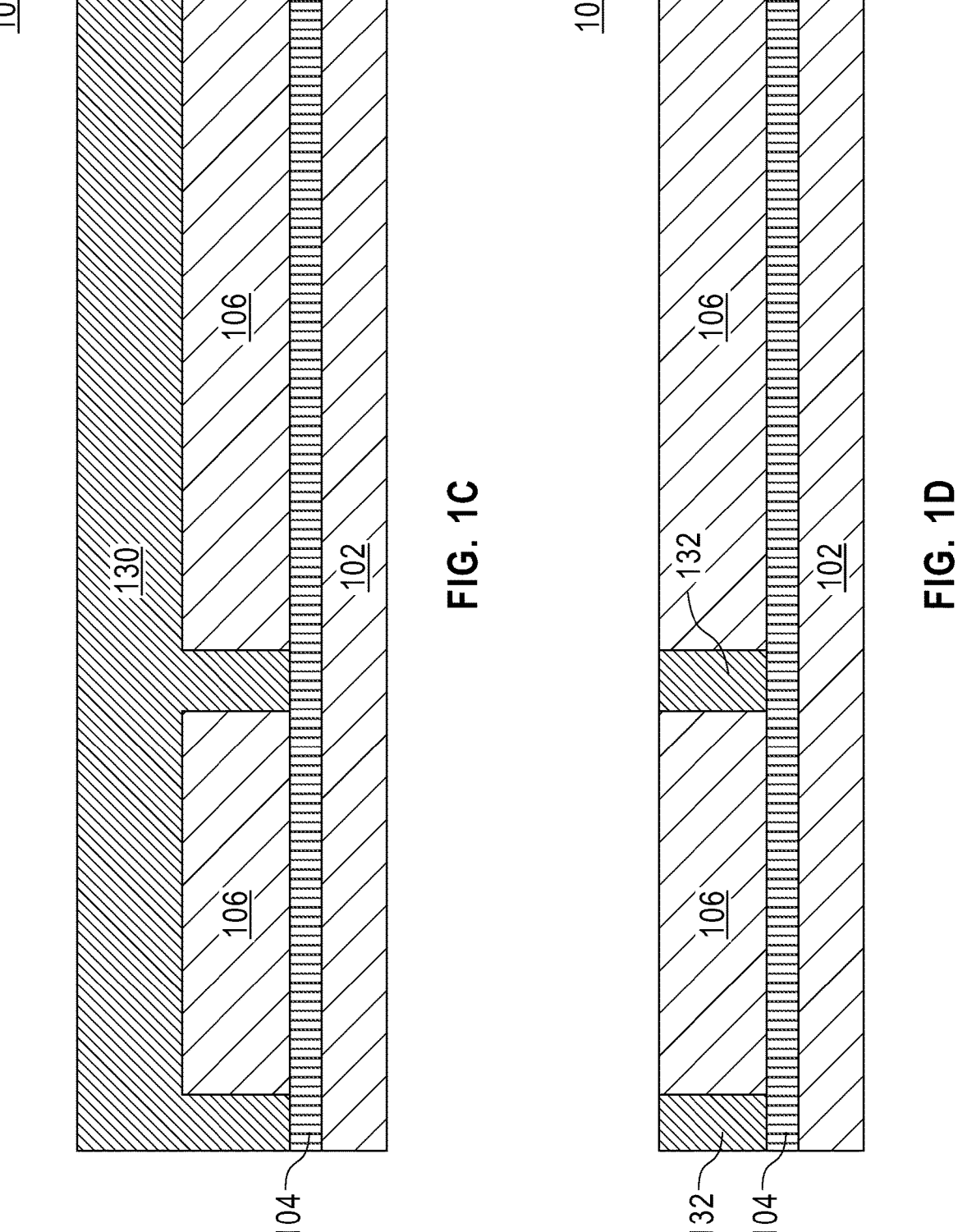
FIG. 1C is a cross-sectional view of the first semiconductor structure after depositing a first electrode material, according to an embodiment of the present disclosure.
FIG. 1D is a cross-sectional view of the first semiconductor structure after forming first guiding structures, according to an embodiment of the present disclosure.
Figures 1E, 1F:
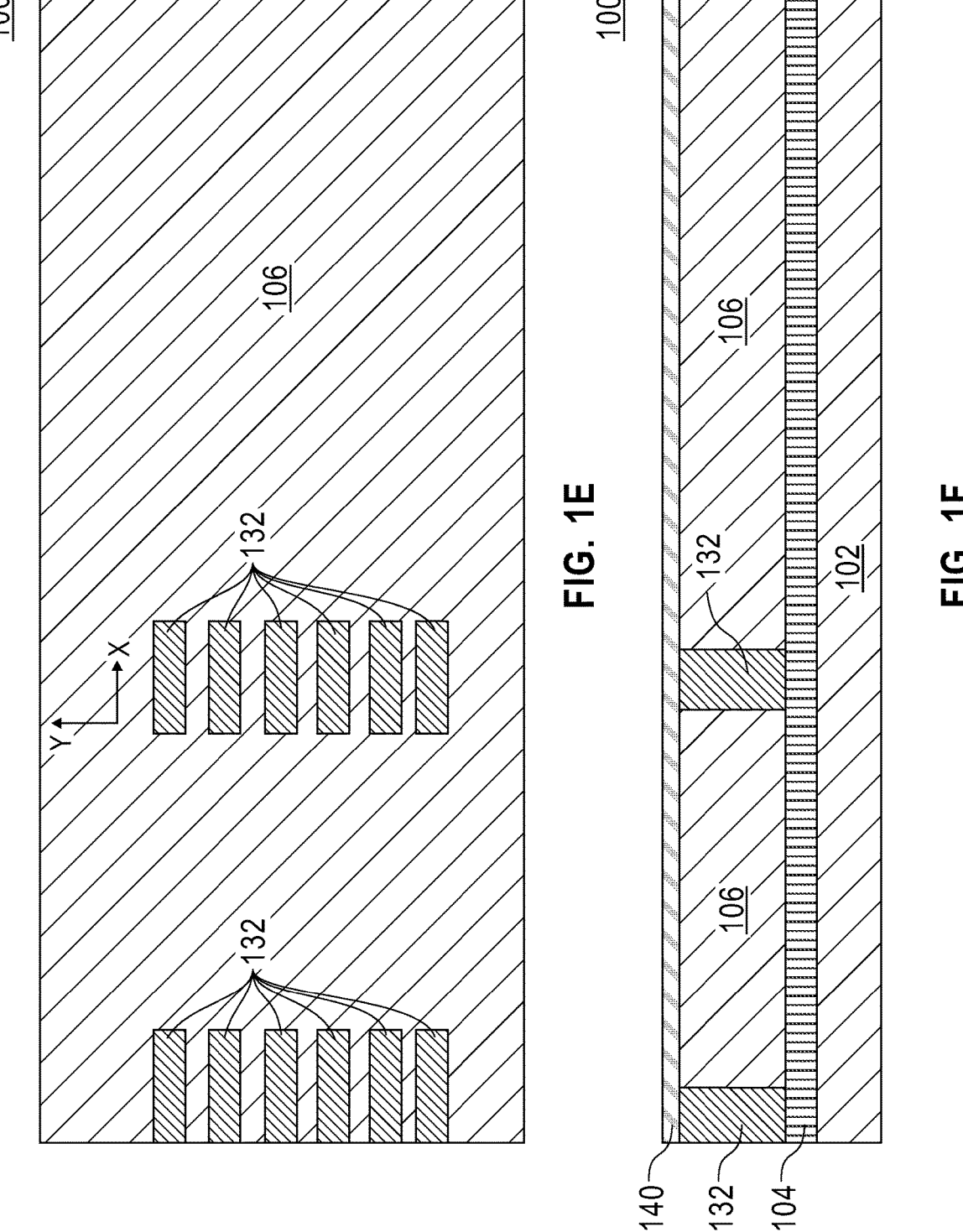
FIG. 1E is a top-down view of the first semiconductor structure depicting the first guiding structures, according to an embodiment of the present disclosure.
FIG. 1F is a cross-sectional view of the first semiconductor structure depicting depositing a first hardmask layer, according to an embodiment of the present disclosure.

Referring now to FIGS. 1C-1D simultaneously, cross-sectional views of the first semiconductor structure 100 are shown after depositing a first magnetic material 130 within the first trenches 120 to form first guiding structures 132, according to an embodiment of the present disclosure. FIG. 1E is a top-down view of the semiconductor structure 100 depicting the plurality of first guiding structures 132 formed in the SOI layer 106.

The first guiding structures 132 can be formed by depositing a layer of the first magnetic material 130 above the SOI layer 106 using well-known conformal deposition processes, such as atomic layer deposition (ALD), or chemical vapor deposition (CVD) followed by a planarization process (e.g., CMP).

Non-limiting examples of first magnetic material 130 for forming the first guiding structures 132 may include Iron (Fe), Nickel (Ni), Cobalt (Co), or any combination thereof. In other embodiments, the first magnetic material 130 may include, for example, Neodymium magnets (which have Nickel and Boron components as well), Samarium Cobalt magnets, and Aluminum/Nickel/Cobalt magnets (ALNICO). The Neodymium magnets are the strongest, followed by the Samarium Cobalt magnets, and then the ALNICO magnets. In one or more embodiments, a magnetic annealing process can be subsequently conducted on the semiconductor structure 100 to magnetize the first guiding structures 132.

According to an embodiment, the embedded first guiding structures 132 create a magnetic field oriented along the long axis (i.e., X-direction) of the first guiding structures 132, as depicted in FIG. 1E. More particularly, the first guiding structures 132 create the magnetic field in proximity to regions of the SOI layer 106 to be etched deflecting the trajectory of RIE ions as they move through the gas to form angled or slanted profiles within the SOI layer 106, as will be described in detail below.

Referring now to FIGS. 1F-1I simultaneously, cross-sectional views of the first semiconductor structure 100 are shown after depositing a first hardmask layer 140, forming a second photoresist layer 142, and patterning the first hardmask layer 140 to form second trenches 150 and third trenches 152 in the SOI layer 106, according to an embodiment of the present disclosure.

At this step of the manufacturing process, the first hardmask layer 140 is deposited above and in direct contact with the SOI layer 106 and guiding structures 132. Any suitable deposition process can be used to form the first hardmask layer 140 on the semiconductor structure 100. For example, CVD or ALD deposition can be conducted to form the first hardmask layer 140. Non-limiting examples of materials used to form the first hardmask layer 140 may include Chromium (Cr), Nickel (Ni) and Titanium (Ti). The first hardmask layer 140 may have a thickness varying from approximately 10 nm to 100 nm, although other thicknesses are within the contemplated scope of the invention.

Figures 1G, 1H:
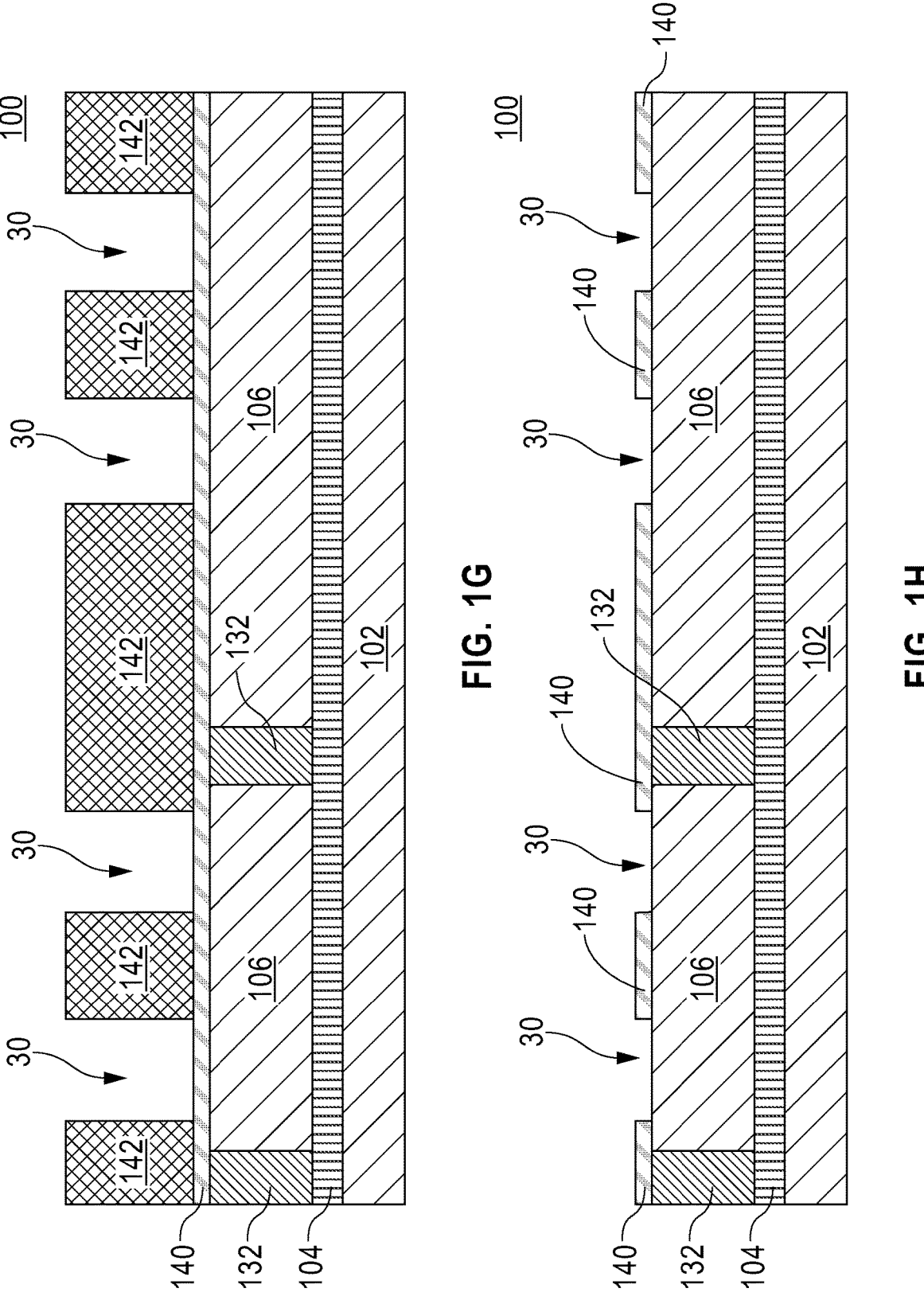
FIG. 1G is a cross-sectional view of the first semiconductor structure depicting forming a second photoresist layer above the first hardmask layer, according to an embodiment of the present disclosure.
FIG. 1H is a cross-sectional view of the first semiconductor structure depicting patterning the first hardmask layer, according to an embodiment of the present disclosure.

A second photoresist layer 142 is formed above the first hardmask layer 140, as depicted in FIG. 1G. A second pattern 30 is exposed on the second photoresist layer 142 to be transferred to the first hardmask layer 140. Particularly, the second photoresist layer 140 is deposited above the first hardmask layer 140 for forming second trenches 150 and third trenches 152 using well-known lithography and reactive ion etch (RIE) processing. Patterning of the first hardmask layer 140 to form the second trenches 150 and third trenches 152 involves exposing the second pattern 30 on the second photoresist layer 142 and transferring the exposed second pattern 30 to the first hardmask layer 140, as shown in FIG. 1H. After transferring the second pattern 30 and forming the second trenches 150 and third trenches 152, the second photoresist layer 142 can be removed using any photoresist striping method known in the art including, for example, plasma ashing.

In some embodiments, the second trenches 150 and third trenches 152 can be formed simultaneously. In other embodiments, the second trenches 150 and third trenches 152 can be formed separately. In the depicted embodiment, the resulting semiconductor structure 100 includes second trenches 150 formed at an angle and third trenches 152 vertically aligned in a direction perpendicular to the base substrate 102. The vertically aligned third trenches 152 can be achieved by controlling a distance between areas of the SOI layer 106 to be etched and the magnetic first guiding structures 132, since areas of the SOI layer 106 that are further away from the first guiding structures 132 will not be affected by the magnetic field generated by the first guiding structures 132. As mentioned above, the first guiding structures 132 create a magnetic field in regions of the SOI layer 106 near the first guiding structures 132 that deflect the trajectory of RIE ions as they move through the gas to form second trenches 150 with angled or slanted profiles within the SOI layer 106.

In one or more embodiments, varied magnetic field strength, or placement relative to the first guiding structures 132 can vary the resulting angle of the second trenches 150. Stated differently, the first guiding structures 132 can be placed in different X or Y orientations to produce different angle directions within the final first semiconductor structure 100. Accordingly, in one or more embodiments, the resulting first semiconductor structure 100 may include a plurality of slanted trench features formed at a variety of different angles and orientations (e.g., X and Y orientations) on the same substrate at the same time. For example, the first semiconductor structure 100 may include one or more slanted trench features (i.e., second trenches 150) formed at an orientation angle different from 90 degrees and one or more slanted trench features (i.e., third trenches 152) formed at an orientation angle equal to 90 degrees.

Figures 1I, 1J:
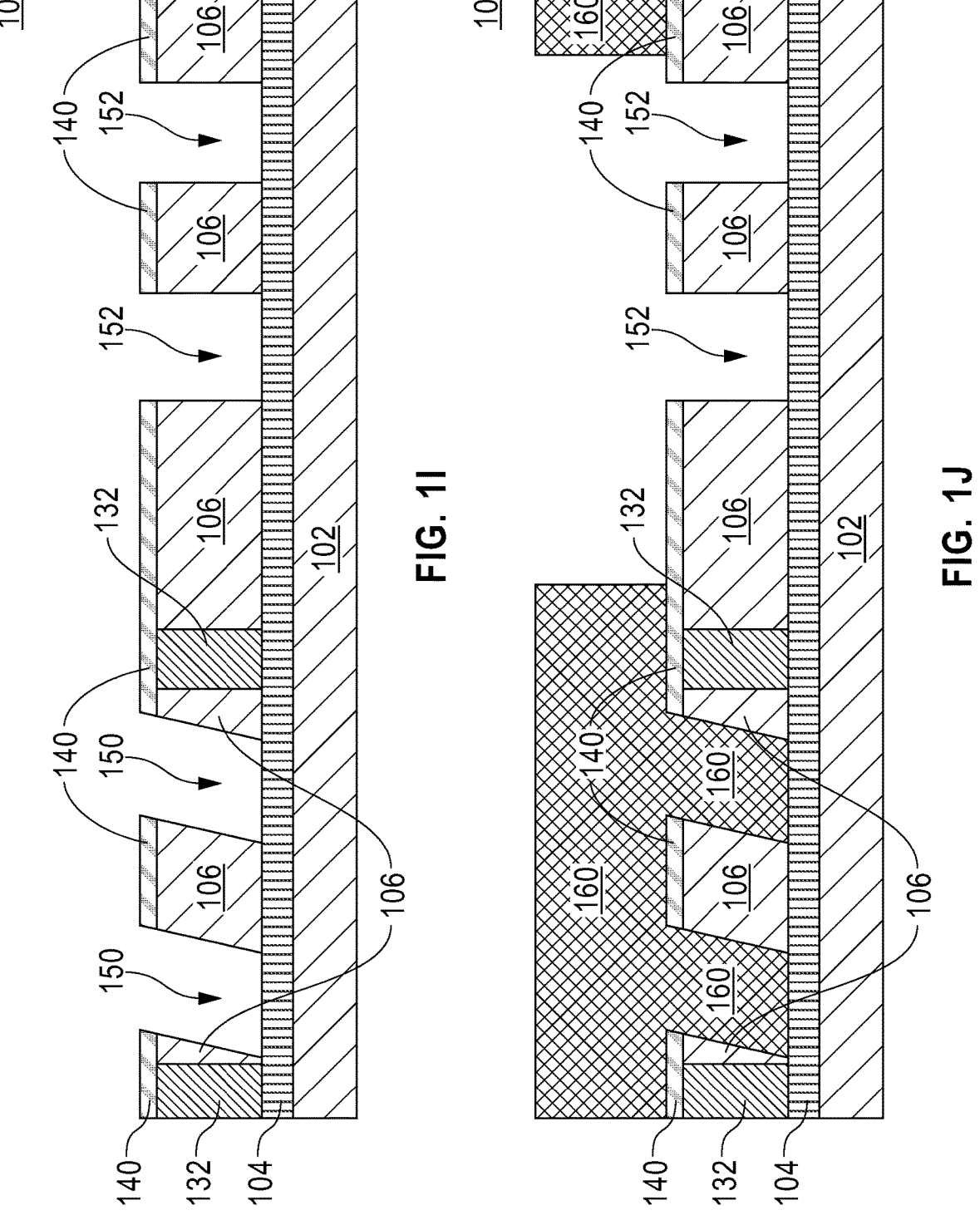
FIG. 1I is a cross-sectional view of the first semiconductor structure depicting forming second trenches and third trenches within a silicon-on-insulator layer, according to an embodiment of the present disclosure.
FIG. 1J is a cross-sectional view of the first semiconductor structure depicting forming a third photoresist layer or block mask, according to an embodiment of the present disclosure.
Figures 1K, 2A:
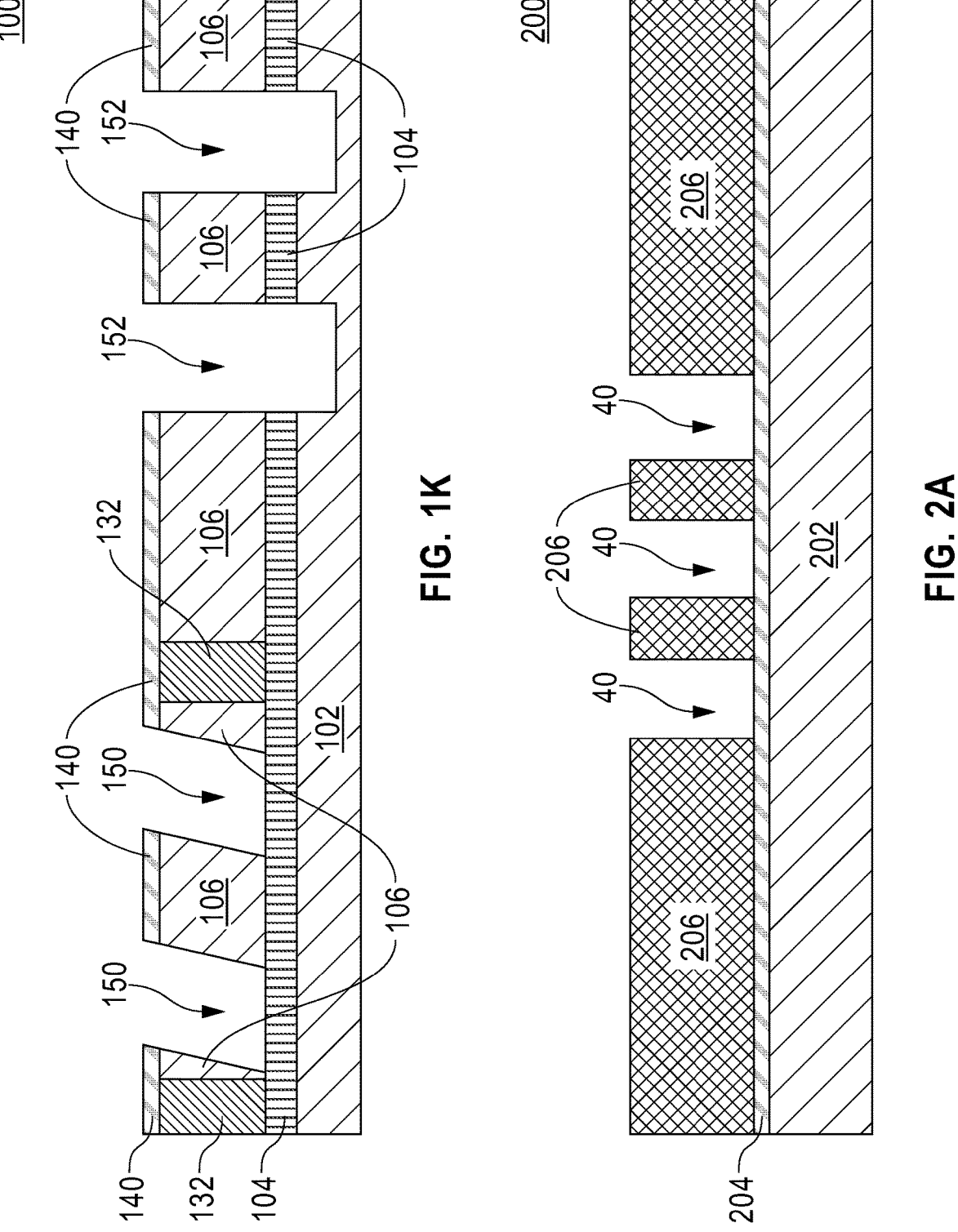
FIG. 1K is a cross-sectional view of the first semiconductor structure depicting further etching third trenches, according to an embodiment of the present disclosure.
FIG. 2A is a cross-sectional view of a second semiconductor structure after forming a second hardmask layer and a fourth photoresist layer above the second hardmask layer, according to an embodiment of the present disclosure.

Referring now to FIGS. 1J-1K simultaneously, cross-sectional views of the first semiconductor structure 100 are shown after forming a third photoresist layer or block mask 160 to further etch third trenches 152, according to an embodiment of the present disclosure.

Alternatively, or additionally, the block mask 160 can be formed using well-known deposition techniques to protect the second trenches 150 during a subsequent etching process. As depicted in FIG. 1J, third trenches 152 are not covered by the block mask 160. A RIE process is then performed on the semiconductor structure 100 to further etch the third trenches 152. Etching the third trenches 152 increases a depth of the third trenches 152. During the RIE process, areas of the buried oxide layer 104 can be removed causing the extended third trenches 152 to reach the base substrate 102. After further etching the third trenches 152, the block mask 160 can be removed using any photoresist striping method known in the art including, for example, plasma ashing.

In some embodiments, the first hardmask layer 140 may remain within the first semiconductor structure 100. In other embodiments, the first hardmask layer 140 can be removed from the first semiconductor structure 100.

Alternatively, or additionally, a thin layer of a dielectric material (not shown) such as, for example, $SiO_2$ or SiN can be conformally deposited on the first semiconductor structure 100 for stability and uniformity purposes. More particularly, the thin layer of conformal dielectric material can be deposited on a perimeter of the first semiconductor structure 100 formed by top surfaces of the first hardmask layer 140, second trenches 150 and third trenches 152. In embodiments in which the first hardmask layer 140 is removed from the first semiconductor structure 100, the thin layer of conformal dielectric material can be deposited on a perimeter of the first semiconductor structure 100 formed by top surfaces of the first guiding structures 132, top surfaces of the SOI layer 106, second trenches 150 and third trenches 152. The thin layer of conformal dielectric material may have a thickness varying from approximately 5 to approximately 20 nm, and ranges therebetween, and can be deposited using any conformal deposition process including, but not limited to, CVD, PECVD or ALD.

Figures 2B, 2C:
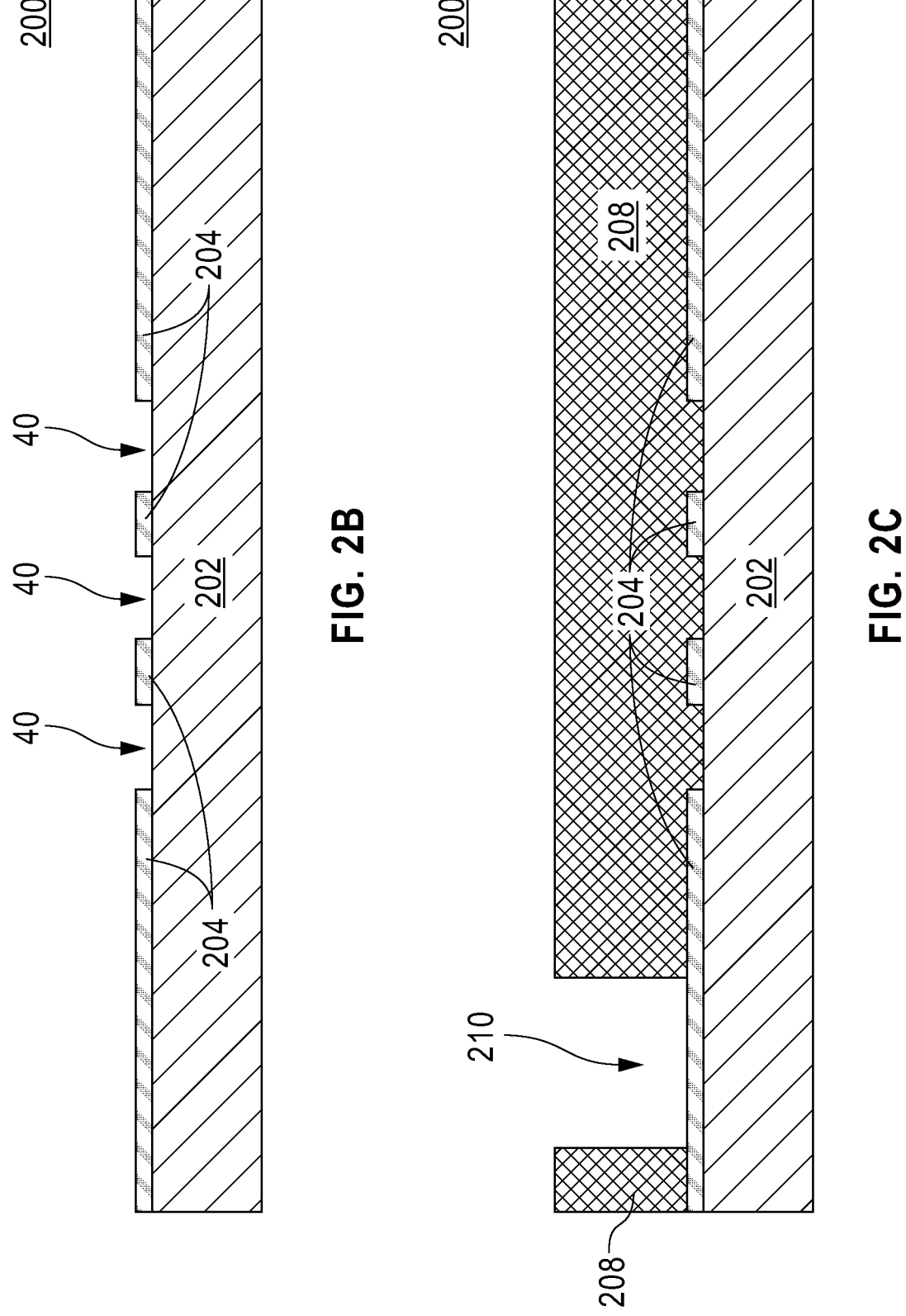
FIG. 2B is a cross-sectional view of the second semiconductor structure after patterning the second hardmask layer and removing the fourth photoresist layer, according to an embodiment of the present disclosure.
FIG. 2C is a cross-sectional view of the second semiconductor structure after forming an opening within a fifth photoresist layer partially covering the second hardmask layer, according to an embodiment of the present disclosure.

Referring now to FIGS. 2A-2C simultaneously, cross-sectional views of a second semiconductor structure 200 are shown after forming a second hardmask layer 204, forming a fourth photoresist layer 206 and forming an opening 210 within a fifth photoresist layer 208, according to another embodiment of the present disclosure.

In the depicted embodiment, the second semiconductor structure 200 includes a second substrate 202, a second hardmask layer 204 formed above the second substrate 202 and a fourth photoresist layer 206 disposed above the second hardmask layer 204. According to an embodiment, the second substrate 202 is substantially similar to the first substrate 10 shown in FIG. 1A. Thus, although not depicted in the figures, the second substrate 202 may include a silicon-on-insulator substrate (SOI) composed of a base substrate, a buried oxide formed on top of the base substrate and a SOI layer formed on top of the buried oxide. In some embodiments, the second substrate 202 may include a bulk substrate. It should be noted that some elements and/or features of the semiconductor structure 200 are illustrated in the figures but not described in detail in order to avoid unnecessarily obscuring the presented embodiments.

The second hardmask layer 204 and fourth photoresist layer 206 may include analogous materials and be formed in similar ways as the first hardmask layer 140 and first photoresist layer 110 previously described.

The fourth photoresist layer 206 is formed above the second hardmask layer 204, as depicted in FIG. 2A. A fourth pattern 40 is exposed on the fourth photoresist layer 206 to be transferred to the second hardmask layer 204. Well-known lithography and RIE processing can be used to transfer the fourth pattern 40 to the second hardmask layer 204, as shown in FIG. 2B.

After transferring the fourth pattern 40 to the second hardmask layer 204, a fifth photoresist layer 208 is formed on the second semiconductor structure 200 to protect the patterned section of the second hardmask layer 204. An opening 210 is formed within the fifth photoresist layer 208 using well-known etching techniques. The opening 210 is in a region of the second hardmask layer 204 located in the vicinity of the patterned section of the second hardmask layer 204. The opening 210 within the fifth photoresist layer 208 exposes an upper portion of the second hardmask layer 204, as shown in FIG. 2C.

Figures 2D, 2E:
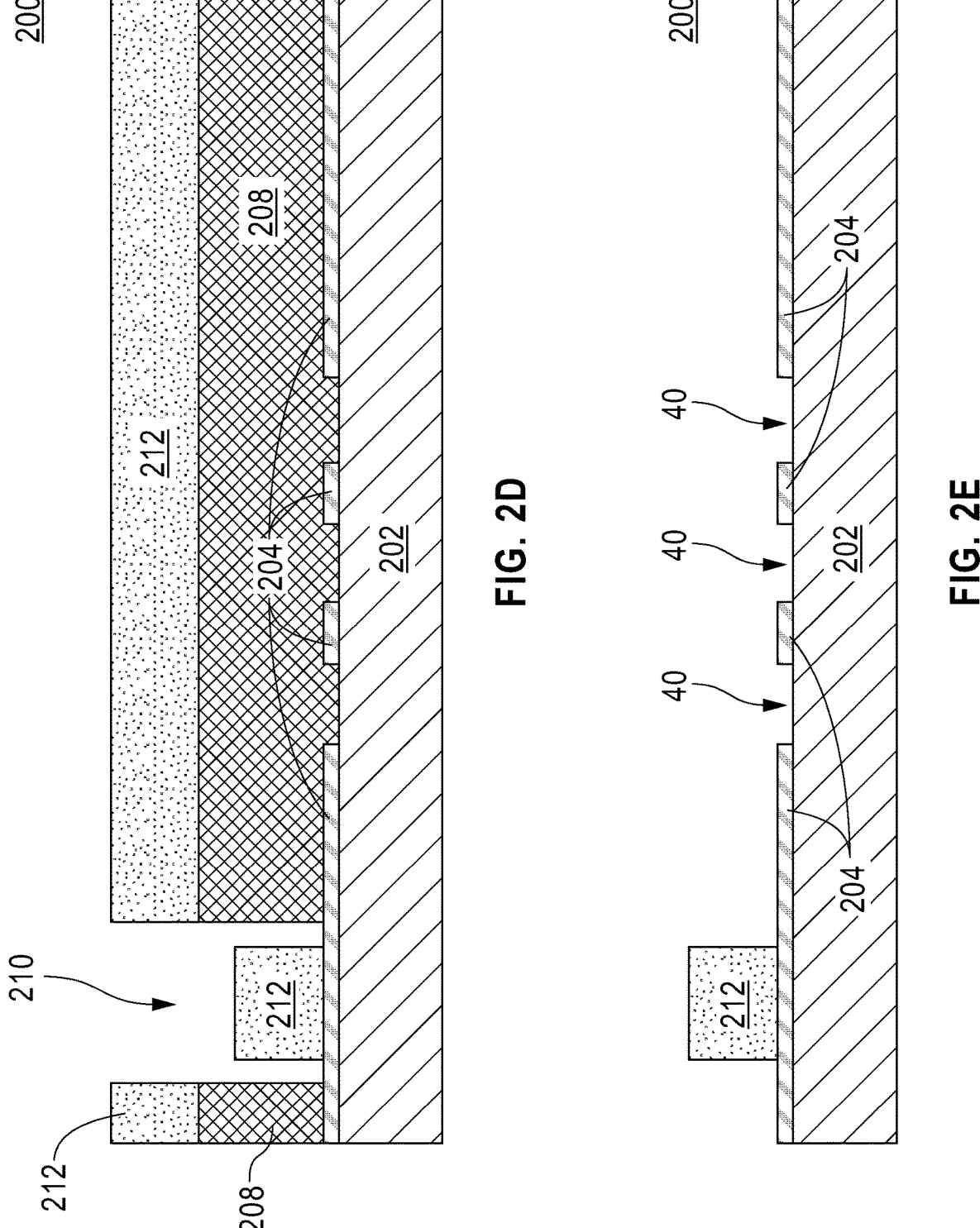
FIG. 2D is a cross-sectional view of the second semiconductor structure after depositing a second electrode material within the opening, according to an embodiment of the present disclosure.
FIG. 2E is a cross-sectional view of the second semiconductor structure after removing the fifth photoresist layer, according to an embodiment of the present disclosure.

Referring now to FIGS. 2D-2E simultaneously, cross-sectional views of the second semiconductor structure 200 are shown after depositing a second magnetic material 212 within the opening 210 and removing the fourth photoresist layer 206, according to another embodiment of the present disclosure.

A non-conformal deposition process can be used to form the second magnetic material 212 on the second semiconductor structure 200. As illustrated in FIG. 2D, the second magnetic material 212 deposits above the fourth photoresist layer 208 and above the exposed upper surface of the second hardmask layer 204. Due to the nature of the deposition process, a portion of the second magnetic material 212 deposited within the opening 210 does not cover an entire exposed upper surface of the second hardmask layer 204. Non-limiting examples of deposition processes to form the second magnetic material 212 may include metal evaporation and sputter deposition. In an exemplary embodiment, the portion of the second magnetic material 212 formed within the opening 210 may have a thickness varying from approximately 100 nm to approximately 2000 nm, and ranges therebetween.

The second magnetic material 212 may be composed of substantially the same materials as the first magnetic material 130 described above with reference to FIG. 1C. After depositing the second magnetic material 212, any suitable photoresist striping method known in the art can be used to remove the fourth photoresist layer 208 and portions of the second magnetic material 212 disposed above the fourth photoresist layer 208. For example, a solvent lift off process can be used to remove the excess second magnetic material 212 and the fourth photoresist layer 208. Removing the fourth photoresist layer 208 exposes the patterned sections of the second hardmask layer 204.

Figures 2F, 2G, 2H:
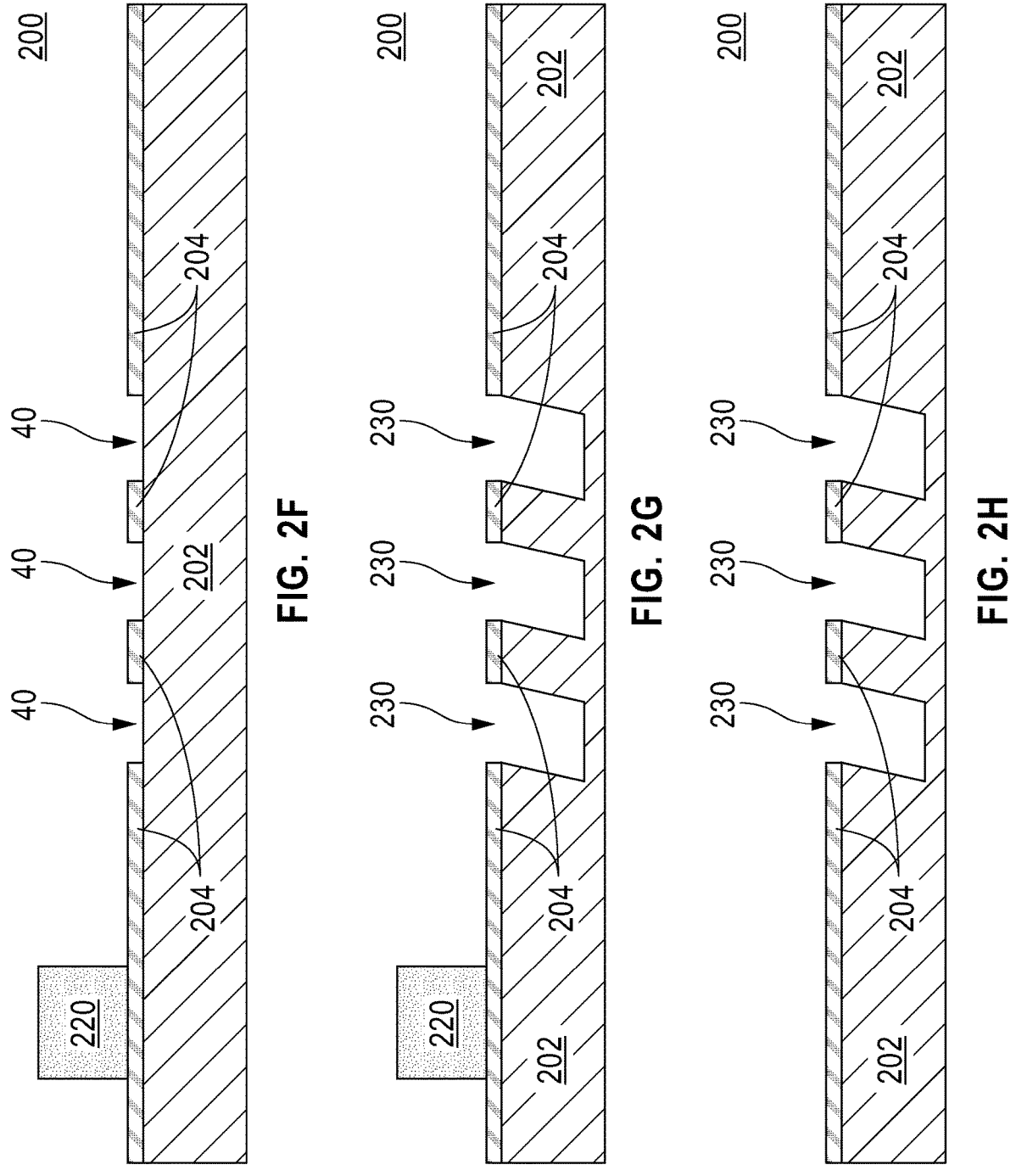
FIG. 2F is a cross-sectional view of the second semiconductor structure after conducting a magnetic annealing process to form second guiding structures, according to an embodiment of the present disclosure.
FIG. 2G is a cross-sectional view of the second semiconductor structure after transferring a fourth pattern to form fifth trenches, according to an embodiment of the present disclosure.
FIG. 2H is a cross-sectional view of the second semiconductor structure after forming fifth trenches and removing the second guiding structures, according to an embodiment of the present disclosure.

Referring now to FIGS. 2F-2H simultaneously, cross-sectional views of the second semiconductor structure 200 are shown after conducting a magnetic annealing process to form second guiding structures 220, transferring the fourth pattern 40 to the second substrate 202 to form fifth trenches

230, and removing the second guiding structures 220, according to another embodiment of the present disclosure.

In one or more embodiments, a magnetic annealing process can be subsequently conducted on the second semiconductor structure 200 to magnetize the second magnetic material 212 and form second guiding structures 220. In this embodiment, the second guiding structures 220 are formed above the second hardmask layer 204 instead of embedded within the second substrate 202 allowing for the removal of the second guiding structures 220 after etching the second substrate 202. Similar to the first guiding structures 132, the second guiding structures 220 create a magnetic field near regions of the second substrate 202 to be etched (i.e., areas of the second substrate 202 underneath the patterned sections of the second hardmask layer 204) deflecting the trajectory of RIE ions as they move through the gas to form angled or slanted trench features within the second substrate 202, as shown in FIG. 2G. A conventional RIE process can be conducted on the second semiconductor structure 200 to form fourth trenches 230 within the second substrate 202.

The fourth trenches 230 include an angled or slanted profile caused by the deflected trajectory of the RIE ions. In one or more embodiments, varied magnetic field strength, or placement relative to the second guiding structures 220, can vary the resulting angle of the fourth trenches 230. Stated differently, the second guiding structures 210 can be placed in different X or Y orientations to produce different angle directions within the final second semiconductor structure 200, as previously described.

After forming the fourth trenches 230, a wet etch or CMP process can be conducted on the second semiconductor structure 200 to remove the second guiding structures 210. Although not depicted in the figures, it should be noted that the etching process to form the fourth trenches 230 may be stopped at a buried oxide layer of the second substrate 202 similar to the buried oxide layer 104 described above. Also, it may be understood that the second semiconductor structure 200 may include slanted or angled trench features such as the fourth trenches 230 together with vertically aligned trench features formed within the same second substrate 202, as the second and third trenches 150, 152 described above with reference to FIG. 1I.

In some embodiments, the second hardmask layer 204 may remain within the second semiconductor structure 200, as depicted in FIG. 2H. In other embodiments, the second hardmask layer 204 can be removed from the second semiconductor structure 200.

Alternatively, or additionally, a thin layer of a dielectric material (not shown) such as, for example, $SiO_2$ or SiN can be conformally deposited on the second semiconductor structure 200 for stability and uniformity purposes. More particularly, the thin layer of conformal dielectric material can be deposited on a perimeter of the second semiconductor structure 200 formed by top surfaces of the second hardmask layer 204 and fourth trenches 230. In embodiments in which the second hardmask layer 204 is removed from the second semiconductor structure 200, the thin layer of conformal dielectric material can be deposited on a perimeter of the second semiconductor structure 200 formed by top surfaces of the second substrate 202 and fourth trenches 230. The thin layer of conformal dielectric material (not shown) may have a thickness varying from approximately 5 nm to approximately 20 nm, and ranges therebetween, and can be deposited using any conformal deposition process including, but not limited to, CVD, PECVD or ALD.

Thus, embodiments of the present disclosure provide a semiconductor structure, and a method of making the same, that combines angled structures (e.g., 45 degrees) and vertical structures (e.g., 90 degrees) within a single silicon substrate by generating a magnetic field in close proximity to specific regions of the substrate using magnetic guiding structures. In one or more embodiments, multiple different magnetic guiding structures can be formed in the same substrate to introduce different angles in different regions of the substrate. Fine lithography can be used to enable placement of the magnetic material near specific structures to enable better control of the etched profile. In some embodiments, magnetic materials can be used for some arrays and non-magnetic materials can be used for other arrays to introduce different profiles in different structures.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first plurality of slanted features within a first region of a substrate; and
two or more magnetic guiding structures embedded within the first region of the substrate, and the first plurality of slanted features being located between the two or more magnetic guiding structures for varying a magnetic field strength around the first plurality of slanted features.

2. The semiconductor structure of claim 1, further comprising:
a second plurality of slanted features within a second region of the substrate, the second region of the substrate being adjacent to the first region of the substrate.

3. The semiconductor structure of claim 2, further comprising:
a hardmask layer above the first region and the second region of the substrate; and
a dielectric material conformally deposited on the first region and the second region of the substrate.

4. The semiconductor structure of claim 2, wherein the second plurality of slanted features includes a second orientation angle.

5. The semiconductor structure of claim 4, wherein the second orientation angle is equal to 90 degrees.

6. The semiconductor structure of claim 2, wherein a second depth of the second plurality of slanted features is deeper than a first depth of the first plurality of slanted features.

7. The semiconductor structure of claim 2, wherein the first plurality of slanted features includes a first orientation angle, and wherein the second plurality of slanted features includes a second orientation angle that is different from the first orientation angle.

8. The semiconductor structure of claim 1, wherein the first plurality of slanted features includes a first orientation angle.

9. The semiconductor structure of claim 8, wherein the first orientation angle is different from 90 degrees.

10. The semiconductor structure of claim 8, wherein the magnetic field strength around the first plurality of slanted features deflect a trajectory of reactive ion etch ions for varying the first orientation angle of the first plurality of slanted features.

11. The semiconductor structure of claim 1, wherein the two or more magnetic guiding structures embedded within the first region of the substrate includes a magnetic structure composed of a magnetic material.

12. The semiconductor structure of claim 11, wherein the magnetic material is selected from the group consisting of Iron, Nickel, Cobalt Neodymium magnets, Samarium Cobalt magnets, and Aluminum/Nickel/Cobalt magnets.

13. A method of forming a semiconductor structure, comprising:

forming a first plurality of slanted trench features within a first region of a substrate, the first plurality of slanted trench features being located between two or more guiding structures, and the two or more guiding structures being embedded within the first region of the substrate for generating a magnetic field near the first plurality of slanted trench features; and forming a second plurality of slanted trench features within a second region of the substrate, the second region of the substrate being adjacent to the first region of the substrate.

14. The method of claim 13, wherein a distance between the first region of the substrate and the second region of the substrate is selected based on the magnetic field not affecting the second region of the substrate.

15. The method of claim 13, wherein forming the first plurality of slanted trench features further comprises:

forming a first photoresist layer over the substrate;

patterning the first photoresist layer to form first trenches within the first region of the substrate;

depositing an electrode material within the first trenches; and conducting a magnetic annealing process on the electrode material to form the two or more guiding structures.

16. The method of claim 15, further comprising:

forming a hardmask layer above the substrate;

forming a second photoresist layer over the hardmask layer;

patterning the hardmask layer; and conducting an etching process to form the first plurality of slanted trench features within the first region of the substrate and the second plurality of slanted trench features within the second region of the substrate adjacent to the first region of the substrate, the first plurality of slanted trench features being at a first orientation angle, the second plurality of slanted trench features being at a second orientation angle different from the first orientation angle.

17. The method of claim 16, wherein the magnetic field near the first plurality of slanted trench features deflect a trajectory of reactive ion etch ions for varying the first orientation angle of the first plurality of slanted trench features.

18. The method of claim 13, further comprising:

forming a third photoresist layer on the first region of the substrate; and conducting an etching process to extend a depth of the second plurality of slanted trench features in the second region of the substrate.

19. The method of claim 13, wherein the two or more guiding structures embedded within the first region of the substrate includes a magnetic structure composed of a magnetic material.

20. The method of claim 19, wherein the magnetic material is selected from the group consisting of Iron, Nickel, Cobalt Neodymium magnets, Samarium Cobalt magnets, and Aluminum/Nickel/Cobalt magnets.

21. A semiconductor structure, comprising:

a first plurality of slanted features within a first region of a substrate wherein the first plurality of slanted features includes a first orientation angle that includes a first vertical angle different from 90 degrees;

a second plurality of slanted features within a second region of the substrate, the second region of the substrate being adjacent to the first region of the substrate, wherein the second plurality of slanted features includes a second orientation angle different from the first orientation angle and that includes a second vertical angle equal to 90 degrees, the first plurality of slanted features and the second plurality of slanted features providing a mold for nanoimprint lithography; and two or more magnetic guiding structures embedded within the first region of the substrate, and the first plurality of slanted features being located between the two or more magnetic guiding structures for varying a magnetic field strength around the first plurality of slanted features.

22. The semiconductor structure of claim 21, further comprising:

a hardmask layer above the first region and the second region of the substrate.

* * * * *